United States Patent [19]

Lee

[11] Patent Number: 5,280,186
[45] Date of Patent: Jan. 18, 1994

[54] CCD IMAGE SENSOR WITH FOUR PHASE CLOCKING MECHANISM

[75] Inventor: Sung M. Lee, Seoul, Rep. of Korea

[73] Assignee: Gold Star Electron Co., Chungcheongbuk, Rep. of Korea

[21] Appl. No.: 32,429

[22] Filed: Mar. 15, 1993

Related U.S. Application Data

[63] Continuation of Ser. No. 698,701, May 10, 1991, abandoned.

[30] Foreign Application Priority Data

May 11, 1990 [KR] Rep. of Korea ............... 6731/1990

[51] Int. Cl.⁵ .................. H01L 29/78; H01L 27/14; H01L 31/00
[52] U.S. Cl. .................. 257/232; 257/233; 257/236; 257/245; 257/249; 358/213.22; 358/213.26; 358/213.29; 358/213.31
[58] Field of Search .................. 357/24; 257/231, 232, 257/233, 236, 243, 249; 358/213.22, 213.23, 213.26, 213.29, 213.31

[56] References Cited

U.S. PATENT DOCUMENTS

| | | | |
|---|---|---|---|
| 3,961,355 | 6/1976 | Abbas et al. | 357/24 LR |
| 4,012,587 | 3/1977 | Ochi et al. | 357/24 LR |
| 4,028,716 | 6/1977 | Van Santen et al. | 357/24 LR |
| 4,081,841 | 3/1978 | Ochi et al. | 357/24 LR |
| 4,336,556 | 6/1982 | Sekine et al. | 357/24 LR |
| 4,460,912 | 7/1984 | Takeshita et al. | 357/24 |
| 4,672,455 | 6/1987 | Miyatake | 358/213.31 |
| 4,851,890 | 7/1989 | Miyatake | 357/24 |
| 4,951,148 | 8/1990 | Esser et al. | 358/213.18 |

*Primary Examiner*—Ngan Ngo
*Attorney, Agent, or Firm*—Faegre & Benson

[57] ABSTRACT

An improved CCD image sensor which contains a plurality of photodetectors is provided with a transfer gate and uses a CCD as a scanner for reading signals, and having photo diodes which are connected consecutively to both the left and right sides of VCCD region and, in the parts without VCCD region, are disposed repeatedly parallel to each other separated by an interval of the width of the channel stop region. A 4 phase clock signal consisting of 4 fields is used for operation of said CCD image sensor. The resultant CCD image sensor has an increased photodetector area which can provide high resolution of video.

6 Claims, 8 Drawing Sheets

FIG. 3a
PRIOR ART
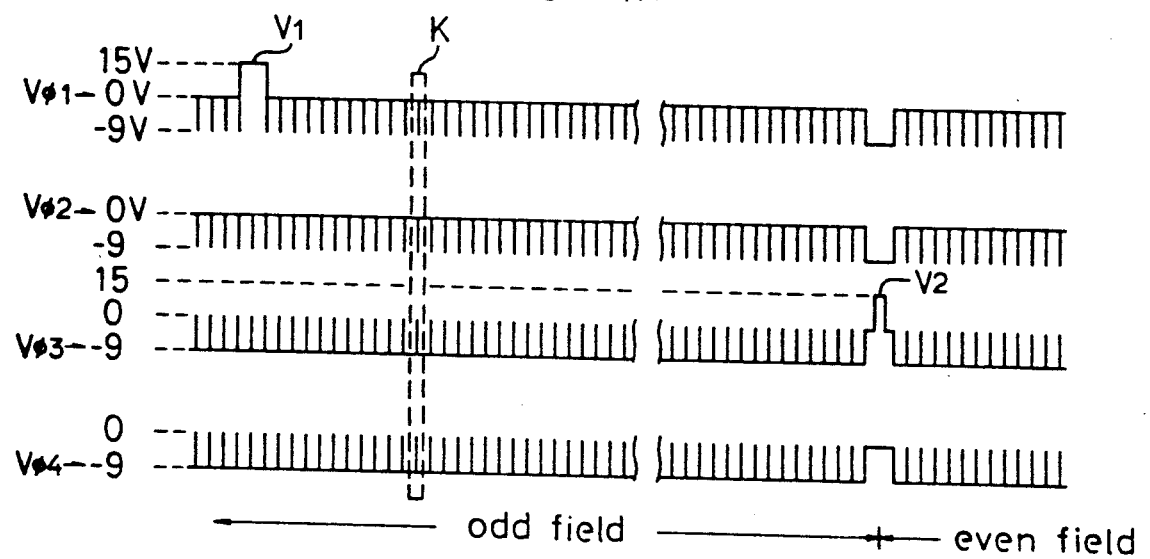
FIG. 3b
PRIOR ART
FIG. 3c
PRIOR ART
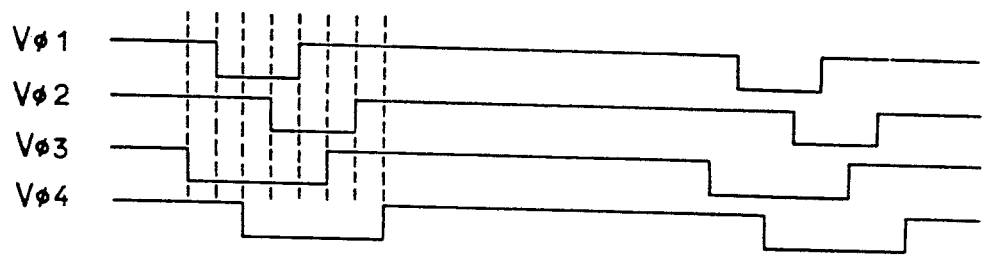

F I G. 5a
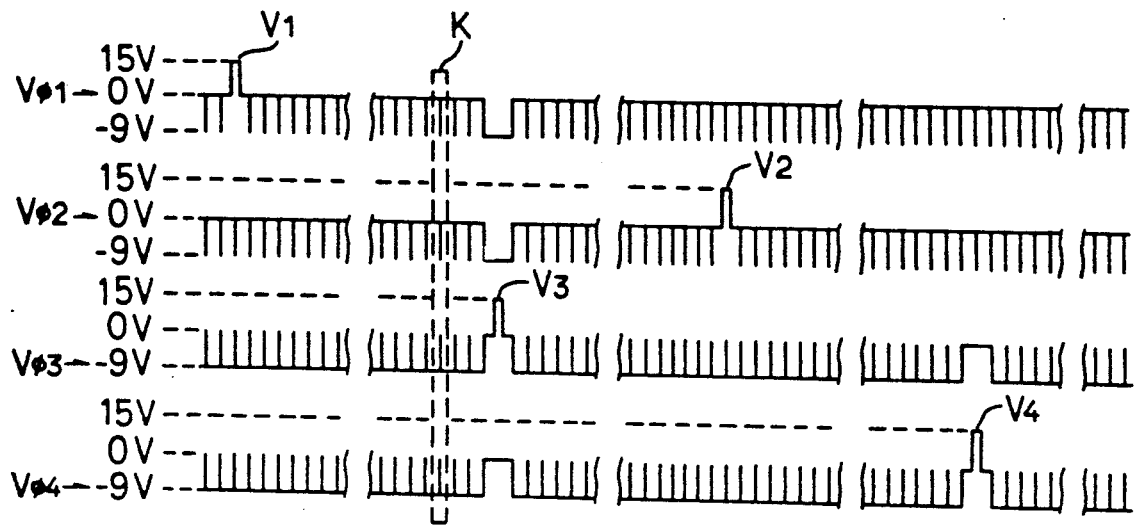
F I G. 5b
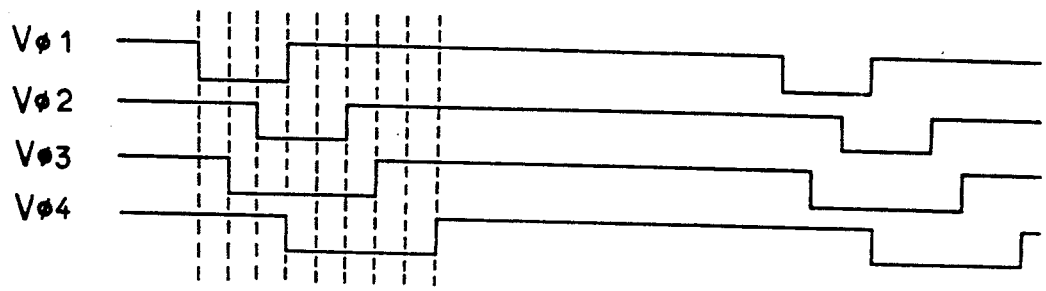

FIG. 5c

| 1 | 3 | 1 | 3 | 1 | 3 |
|---|---|---|---|---|---|
| 4 | 2 | 4 | 2 | 4 | 2 |
| 1 | 3 | 1 | 3 | 1 | 3 |
| 4 | 2 | 4 | 2 | 4 | 2 |
| 1 | 3 | 1 | 3 | 1 | 3 |
| 4 | 2 | 4 | 2 | 4 | 2 |

FIG. 5d

| 1 | $\frac{1+3}{2}$ | 3 | 1 | $\frac{1+3}{2}$ | 3 | 1 | $\frac{1+3}{2}$ | 3 |
|---|---|---|---|---|---|---|---|---|
| 4 | $\frac{4+2}{2}$ | 2 | 4 | $\frac{4+2}{2}$ | 2 | 4 | $\frac{4+2}{2}$ | 2 |
| 1 | $\frac{1+3}{2}$ | 3 | 1 | $\frac{1+3}{2}$ | 3 | 1 | $\frac{1+3}{2}$ | 3 |
| 4 | $\frac{4+2}{2}$ | 2 | 4 | $\frac{4+2}{2}$ | 2 | 4 | $\frac{4+2}{2}$ | 2 |
| 1 | $\frac{1+3}{2}$ | 3 | 1 | $\frac{1+3}{2}$ | 3 | 1 | $\frac{1+3}{2}$ | 3 |
| 4 | $\frac{4+2}{2}$ | 2 | 4 | $\frac{4+2}{2}$ | 2 | 4 | $\frac{4+2}{2}$ | 2 |
| 1 | $\frac{1+3}{2}$ | 3 | 1 | $\frac{1+3}{2}$ | 3 | 1 | $\frac{1+3}{2}$ | 3 |
| 4 | $\frac{4+2}{2}$ | 2 | 4 | $\frac{4+2}{2}$ | 2 | 4 | $\frac{4+2}{2}$ | 2 |
| 1 | $\frac{1+3}{2}$ | 3 | 1 | $\frac{1+3}{2}$ | 3 | 1 | $\frac{1+3}{2}$ | 3 |

CCD IMAGE SENSOR WITH FOUR PHASE CLOCKING MECHANISM

This is a continuation of copending application Ser. No. 07/698,701 filed on May 10, 1991, now abandoned.

BACKGROUND OF THE INVENTION

The present invention relates to a CCD image sensor, and more particularly, to a CCD image sensor which provides improved picture resolution.

CCDs, i.e., charge coupled devices are mainly used for fabricating solid state image sensors or CCD image sensors.

A solid state image sensor is a semiconductor such as silicon onto which a plurality of photodetector and scanner are disposed and can, with a proper photodetector, provide image sensing from the visible region to the infrared region.

As a scanner for solid state image sensor, metal oxide semiconductor (MOS) switches or CCDs have been principally used.

The MOS switch has a problem that it cannot be used for detecting weak signals in which a high signal to noise ratio is required, since the spike noise which occurs during the operation thereof results in a lowering of the signal to noise ratio. Thus, they are hardly used now.

The CCD allows a use of any type of photoconductor as the MOS switch does. In case that the CCD is employed as a scanner, it is preferable to design the CCD part, particularly vertical charge coupled device (hereinafter referred to as a VCCD) in such a way that its surface is as small as possible so that more effective surface of photodetector may be available. This is more important when an interlace manner is adopted, in which a CCD is disposed between photodetectors.

As photodetectors, PN junctions, metal insulator semiconductor (MIS) structures, Schottky junctions and the like are commonly used.

The scanning method using CCDs as a scanner include interlace and non-interlace methods.

In non-interlace method, one frame consists of a plurality of field and the data of input field are scanned to the screen in an order that they are inputted as shown in FIG. 1(a).

The numbers 1, 2, 3 ... in FIG. 1(a) represent that the scanned fields are displayed according to their input order.

In interlace method, one frame consists of even and odd fields and data of the odd fields and then data of the even fields are scanned to the screen in turn.

In FIG. 1(b), numbers 1 and 2 represent odd and even fields, respectively.

The non-interlace method can acquire the accurate actual image of a moving subject due to rapid scanning speed, so that it may be used for military equipment, for example, missile tracking. Its defect is that the video image is vibrated.

The interlace method can provide a stable video image because the scanning speed is low compared to the non-interlace method. However, a rapidly moving subject is displayed in two images. Therefore, it is not suitable for military equipment but may be used for TV broadcasting of NTSC or PAL signals.

The structure of the above conventional CCD image sensor for interlace method will be described with reference to the accompanying FIG. 2(a) to (e).

Hereinafter, the odd-numbered horizontal line in which photo diodes (PD) are disposed is referred to as an odd horizontal line and the even-numbered horizontal line is referred to as an even horizontal line.

FIG. 2(a) shows a block diagram of a CCD image sensor in the conventional interlace method. Each photo diode (PD) is connected consecutively to a corresponding VCCD region (VCCD) in such a way that output video signal charge may be transferred to VCCD in only one direction while each VCCD region (VCCD) is connected to the HCCD region (HCCD) so that signal charges coming out of each photo diode (PD) may be transferred to HCCD region (HCCD) through the first to fourth VCCD clock signals ($V\phi_1$-$V\phi_4$) consisting of 4 phases.

FIG. 2(b) shows a layout diagram of a CCD image sensor according to a structure of FIG. 2(a). A channel stop region (ST) is formed between VCCD region (VCCD) and photo diode (PD). Odd gate electrode ($PG_1$) to which the first and second VCCD clock signals ($V\phi_1$, $V\phi_2$) are applied is formed from VCCD region (VCCD) to channel stop region (ST) so that said odd gate electrode ($PG_1$) may be connected to corresponding transfer gate ($TG_1$) of photo diode (PD) disposed in the odd horizontal line while even gate electrode ($PG_2$) to which the third and fourth VCCD clock signals ($V\phi_3$-$V\phi_4$) are applied, are formed from channel stop region (ST), VCCD region (VCCD) to photo diode (PD) so that said even gate electrode ($PG_2$) may be connected to corresponding transfer gate ($TG_2$) of photo diode (PD) disposed in the even horizontal line.

The desired numbers of the odd gate ($PG_1$) and even gate ($PG_2$) may be formed consecutively in the same form. They are separated from each other by an insulating material which is not shown.

As a material for transfer gates ($TG_1$, $TG_2$), and odd and even gate electrodes ($PG_1$, $PG_2$), poly silicon was used.

The odd gate electrode ($PG_1$) consists of the first odd gate electrode ($PG_{1a}$) which is formed under the photo diode (PD) in the odd horizontal line and to which the second VCCD clock signal ($V\phi_2$) is applied and the second odd gate electrode ($PG_{1b}$) which is formed in the upper region of the photo diode (PD) in the odd horizontal line, to which the first VCCD clock signal ($V\phi_1$) is applied and which is connected to the transfer gate ($TG_1$) of the photo diode (PD) formed in the odd horizontal line.

The even gate electrode ($PG_2$) consists of the first even gate electrode ($PG_{2a}$) which is formed under the photo diode (PD) in the even horizontal line and to which the fourth VCCD clock signal ($V\phi_4$) is applied and the second even gate electrode ($PG_{2b}$) which is formed in the upper region of the photo diode (PD) in the even horizontal line, to which the third VCCD clock signal ($V\phi_3$) is applied and which is connected to the transfer gate ($TG_2$) of the photo diode (PD) formed in the even horizontal line.

The first to fourth VCCD clock signals ($V\phi_1$-$V\phi_4$), which are of four phases, consist of even and odd fields. The clocking of the VCCD will be hereinafter described in more detail.

FIG. 2(c) shows a cross sectional view taken along the a—a' line of FIG. 2(b). A p-type well 200 is formed on the n-type substrate (100). An n-type photo diode (PD) and n-type VCCD region (VCCD), which are formed in the even horizontal line, are disposed consecutively apart from each other by the width of a channel stop region (ST). A transfer gate (TG$_2$) for connecting the photo diode (PD) and the VCCD region (VCCD) is formed in the upper region of the space by which the photo diode (PD) and the VCCD region (VCCD) are separated from each other and, in the upper region of surface of the VCCD region (VCCD), the second even gate electrode (PG$_{2b}$) of even gate electrode (PG$_2$), to which the third VCCD clock signal (V$\phi_3$) is applied, is connected to the corresponding transfer gate (TG$_2$) of the photo diode (PD) in even horizontal line.

The p-type well 200 consists of shallow (200$a$) and deep (200$b$) p-type wells in order to control the over flow drain (OFD) voltage.

On the surface of photo diode (PD), a p$^+$-type thin film 300 is usually formed to apply the initial vias. The figure P$^+$ under the channel stop region (ST) represents channel stop ion.

FIG. 2($d$) shows a cross sectional view taken along the c—c' line of FIG. 2($b$). In FIG. 2($d$), a p-type well 200 is formed on an n-type substrate 100, and n-type photo diode (PD) and n-type VCCD region (VCCD) in the even horizontal line are disposed consecutively apart from each other by a distance of channel stop region and the first even gate electrode (PG$_{2a}$) of the even gate electrode (PG$_2$) to which the fourth VCCD clock signal (V$\phi_4$) is applied, is formed in the upper region of the surface of the VCCD region (VCCD).

In FIG. 2($d$), like FIG. 2($c$), conventional p$^+$-type thin film 300 is formed on the surface of photo diode (PD) and the figure p$^+$ shown under the channel stop region (ST) represents p$^+$-type ion for a channel stop region. The p-type well 200 consists of shallow (200$a$) and deep (200$b$) p-type wells In order to control the OFD voltage.

Accordingly, the transfer gate (TG$_1$) of the photo diode (PD) formed in the odd horizontal line can be driven only by the first VCCD clock signal (V$\phi_1$) which is applied to the second odd gate electrode (PG$_{1b}$) of the odd gate electrode (PG$_1$). Further, the transfer gate (TG$_2$) of the photo diode (PD) formed in the even horizontal line can be driven only by the third VCCD clock signal (V$\phi_3$) which is applied to the second even gate electrode (PG$_{2b}$) of the even gate electrode (PG$_2$).

The second VCCD clock signal (V$\phi_2$) which is applied to the first odd gate electrode (PG$_{1a}$) of the odd gate electrode (PG,) and the fourth VCCD clock signal (V$\phi_4$) which is applied to the first even gate electrode (PG$_{2a}$) of the even gate electrode (PG$_2$) have a function of shifting the image signal charge coming out of the photo diodes (PD) formed in the odd and even horizontal lines to a HCCD (Horizontal Charge Coupled Device).

Hereinafter, operation of the conventional CCD image sensor will be described with reference to the accompanying FIG. 3($a$) which shows a timing diagram of the first to fourth VCCD clock signals (V$\phi_1$-V$\phi_4$) which are of 4 phases.

Each clock signal consists of two fields, i.e., one odd field and one even field.

In the odd field, a transfer gate driving voltage (V$_1$) of high level state (15V) is involved in the first VCCD clock signal (V$\phi_1$) which is applied to the second odd gate electrode (PG$_{1b}$) of the odd gate electrode (PG$_1$).

In the even field, a transfer gate driving voltage (V$_2$) of high level state (15V) is involved in the third VCCD clock signal (V$\phi_3$) which is applied to the second even gate electrode (PG$_{2b}$) of the even gate electrode (PGs).

First, when in the odd field, the first to fourth VCCD clock signals (V$\phi_1$-V$\phi_4$) are applied simultaneously, the transfer gates (TG$_1$) of the photo diodes (PD) formed in each odd horizontal line are turned on simultaneously by the transfer gate driving voltage (V$_1$) involved in the first VCCD clock signal (V$\phi_1$).

Accordingly, an image signal charge generated at the photo diode (PD) is transferred to the VCCD region from which it is moved again to the HCCD region by the clocking operating of VCCD.

FIG. 3($b$) shows a pulse waveform diagram of the applied first to fourth clock signals (V$\phi_1$-V$\phi_4$) in the unit section (K) of FIG. 3($a$).

The image signal charge coming out of the photo diode (PD) by serial clocking operations as shown in FIG. 3($b$) is moved in a vertical direction to the HCCD region (HCCD).

The second VCCD clock signal (V$\phi_2$) which is applied through the first odd gate electrode (PG$_{1a}$) of the odd gate electrode (PG$_1$) formed under the odd horizontal line has a function of shifting the image signal charge coming out of the photo diode (PD) in the odd horizontal line by said first VCCD clock signal (V$\phi_1$) to the HCCD region (HCCD) by aid of said first VCCD clock signal (V$\phi_1$).

In the even field of FIG. 3($a$), when the first to fourth clock signals (V$\phi_1$-V$\phi_4$) are applied simultaneously, the transfer gates (TG$_2$) of the photo diodes (PD) formed in each even horizontal line are turned on by the transfer gate driving voltage (V$_2$) involved in the third VCCD clock signal (V$\phi_3$).

Accordingly, an image signal charge generated at the photo diode (PD) in the even horizontal line is moved in a vertical direction to the HCCD region by the clocking operation, like in FIG. 3($b$) for odd fields.

The fourth VCCD clock signal (VO$\phi_4$) which is applied through the first even gate electrode (PG$_{2a}$) of the even gate electrode (PG$_2$) formed under the even horizontal line has a function of, together with the third VCCD clock signal (V$\phi_3$), shifting the image signal charge coming out of the photo diode (PD) in the even horizontal line by said third VCCD clock signal (V$\phi_3$).

Use of VCCD clock signals of 4 phases makes it possible to transfer more image signal charge than if VCCD clock signals of 2 phases were used.

According to the above description of operation, first, the image signal charges of the photo diodes (PD) disposed in the odd horizontal line are scanned to the screen in due turn by the first to fourth VCCD clock signals (V$\phi_1$-V$\phi_4$) which are of 4 Phases through the VCCD region (VCCD) and HCCD region (HCCD). Then, the image signal charges of the photo diodes (PD) disposed in the even horizontal lines are scanned to the screen in due turn through the VCCD region (VCCD) and HCCD region (HCCD).

The above explained scanning method is called the interlace method.

As shown in FIG. 2($a$), when the signal charge of the photo diodes (PD) disposed in the odd horizontal line, referred to as 1, and the signal charge of the photo diode (PD) disposed in the even horizontal line, referred to as 2, a state of the screen (the frame) consisting of pixels which are displayed by said image signal charges 1 and 2 may be shown as FIG. 3($c$).

However, such a CCD image sensor of the prior art has problems that, although said CCD image sensor using the interlace method is widely used for TV broadcasting of NTSC or PAL signals, the VCCD region, which does not participate in receiving the image signal, is too broad in view of the total chip surface of said CCD image sensor since the VCCD is disposed between photodetectors. Consequently, it is hard to obtain a high resolution video due to restriction in increasing the photodetectors for improving resolution with defined chip size.

SUMMARY OF THE INVENTION

An object of the invention is to provide a CCD image sensor which has no disadvantage of the prior art and, thus, can be used for systems requiring high resolution by making it possible to decrease CCD region and to increase photodetectors receiving light of image signal in the same chip size.

This object is accomplished by an improved CCD image sensor according to the invention which contains a plurality of photodetectors and uses a CCD as a scanner for reading an image signal.

The improvement is characterized in that photo diodes are connected consecutively to both left and right sides of VCCD region and, in the parts without VCCD region, are disposed repeatedly parallel to each other at a spacing interval of the width of the channel stop region.

The CCD image sensor according to the invention is operated by a 4 phase clock signal consisting of 4 fields.

The CCD image sensor is also provided with four gate electrodes formed through over channel stop region, photodetector and VCCD region, to which the 4 phase clock signal is applied, so that transfer gates of the photodetectors formed in the left upper and lower regions and in the right upper and lower regions with reference to the reference point which is a center of both odd and even horizontal lines in which said photodetectors are disposed may be turned on in different fields respectively by said 4 phase clock signal.

BRIEF DESCRIPTION OF THE DRAWINGS

FIG. 3(a) is a timing diagram of VCCD clock signal in the conventional interlace method;

FIG. 3(b) is a pulse waveform diagram of unit section of FIG. 3(a);

FIG. 3(c) is a Pixel block diagram of a frame according to the conventional interlace method;

FIG. 5(a) is a timing diagram of VCCD clock signal of the present invention;

FIG. 5(b) is a pulse waveform diagram of unit section of FIG. 5(a);

FIG. 5(c) is a Pixel block diagram of a frame according to the invention; and

FIG. 5(d) is an another Pixel block diagram of a frame according to the invention.

DETAILED DESCRIPTION OF THE INVENTION

An embodiment of the present invention will be described in more detail with reference to the accompanying FIG. 4(a) to FIG. 4(d).

Figure 1A:
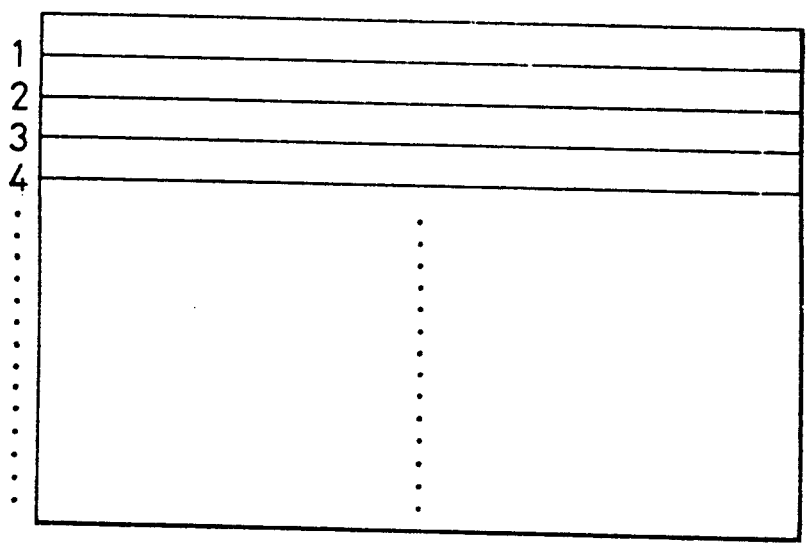
FIG. 1(a) is a reference diagram to explain the non-interlace method.
Figure 1B:
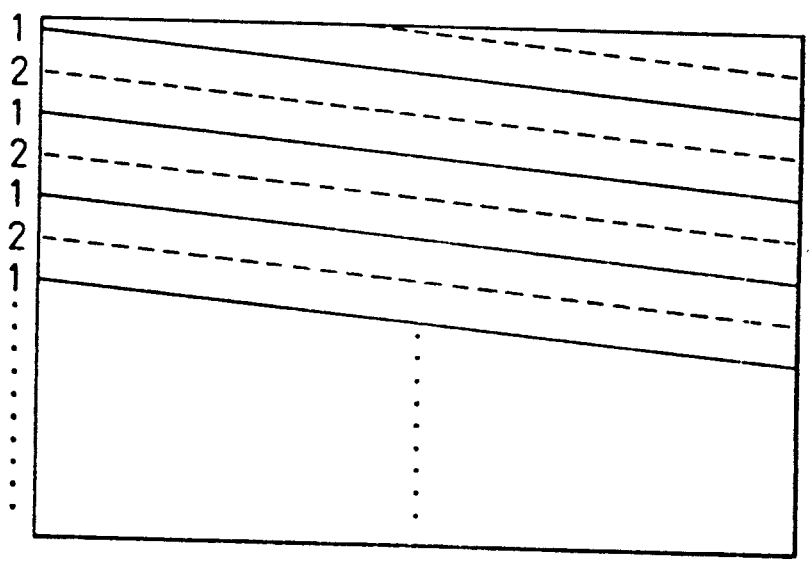
FIG. 1(b) is a reference diagram to explain the interlace method.
Figure 2A:
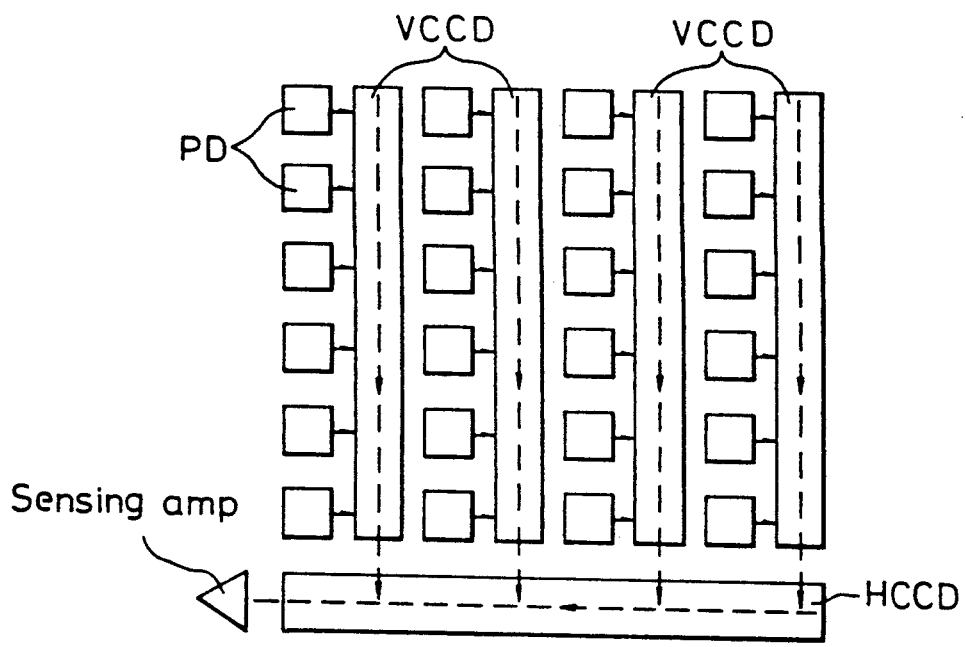
FIG. 2(a) is a block diagram of the CCD image sensor In the conventional method.
Figure 2B:
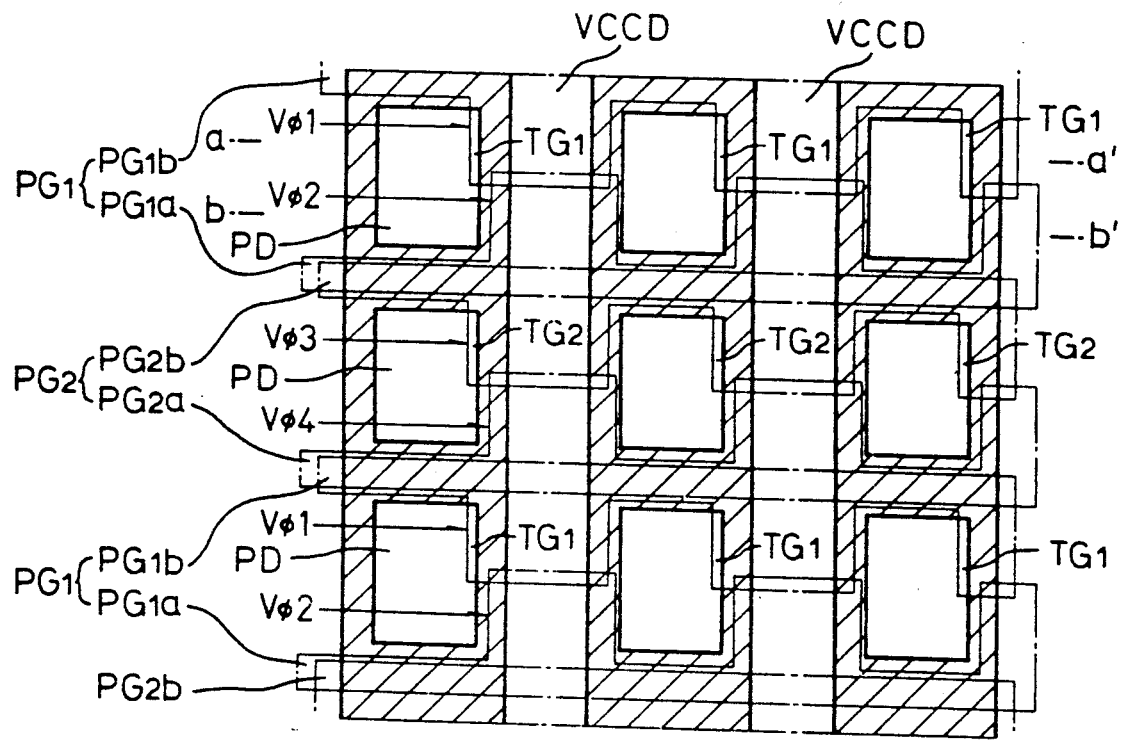
FIG. 2(b) is a layout diagram of FIG. 2(a)
Figure 2C:
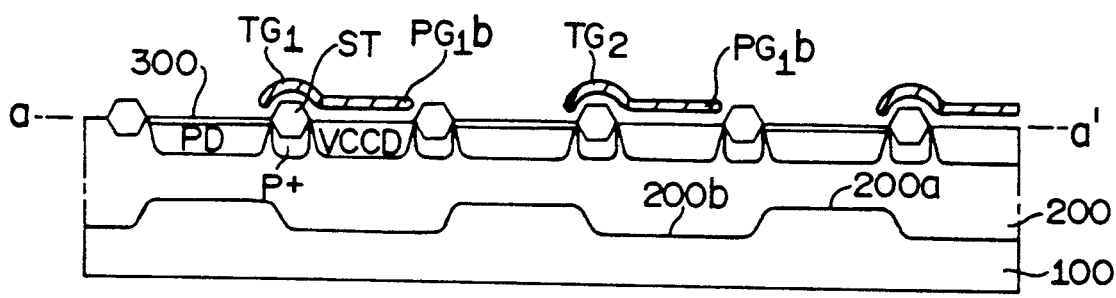
FIG. 2(c) is a cross sectional view taken along the a—a' line of FIG. 2(b)
Figure 2D:
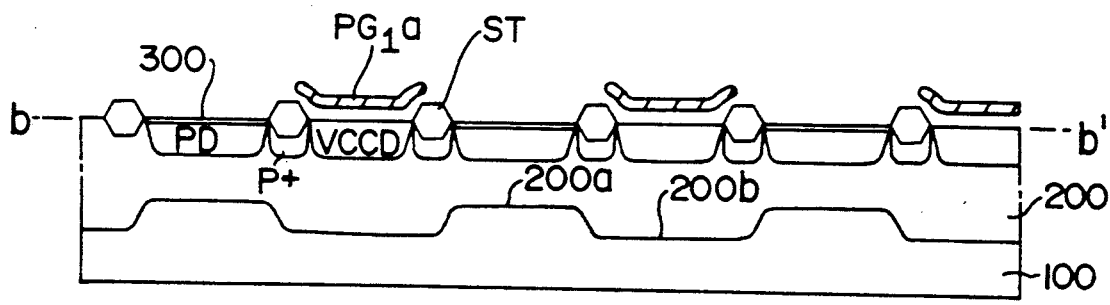
FIG. 2(d) is a cross sectional view taken along the b—b' line of FIG. 2(b)
Figure 4A:
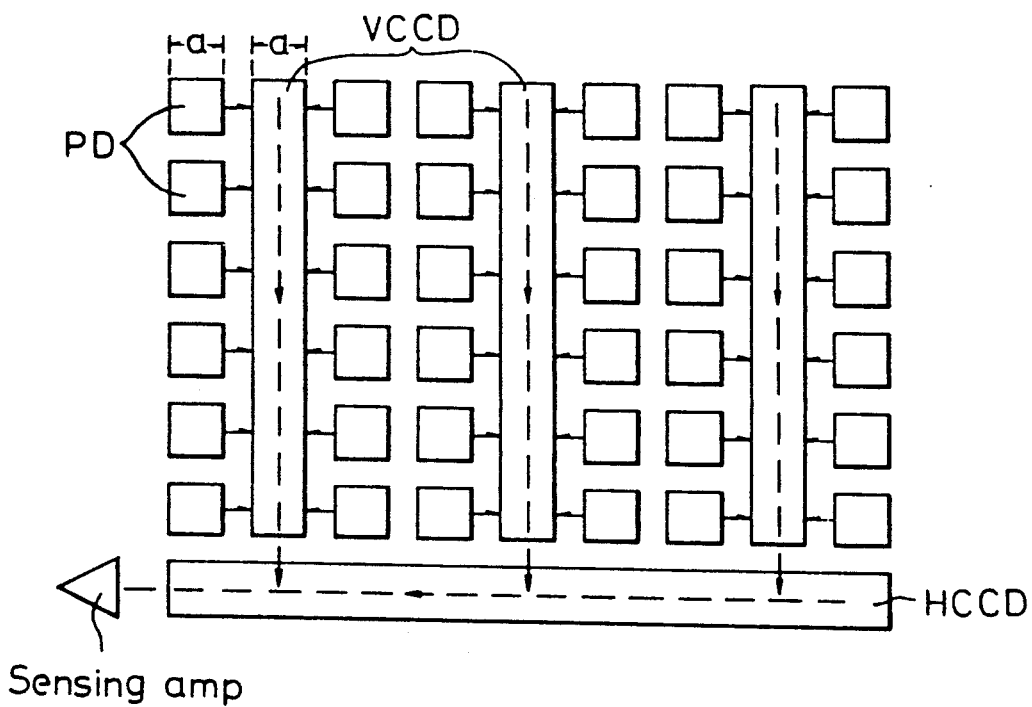
FIG. 4(a) is a block diagram of CCD image sensor according to the invention.

FIG. 4(a) is a block diagram of the CCD image sensor according to the present invention. As shown in FIG. 4(a), photo diodes (PD) are operatively coupled or connected consecutively to both the left and right sides of VCCD regions (VCCD) and are disposed parallel to each other at a separation interval or distance corresponding to the width of channel stop region (ST) in the parts without VCCD regions i.e. the portions of the surface of the sensor between the VCCD portions. The HCCD region (HCCD) is formed under the VCCD regions (VCCD).

Figure 4B:
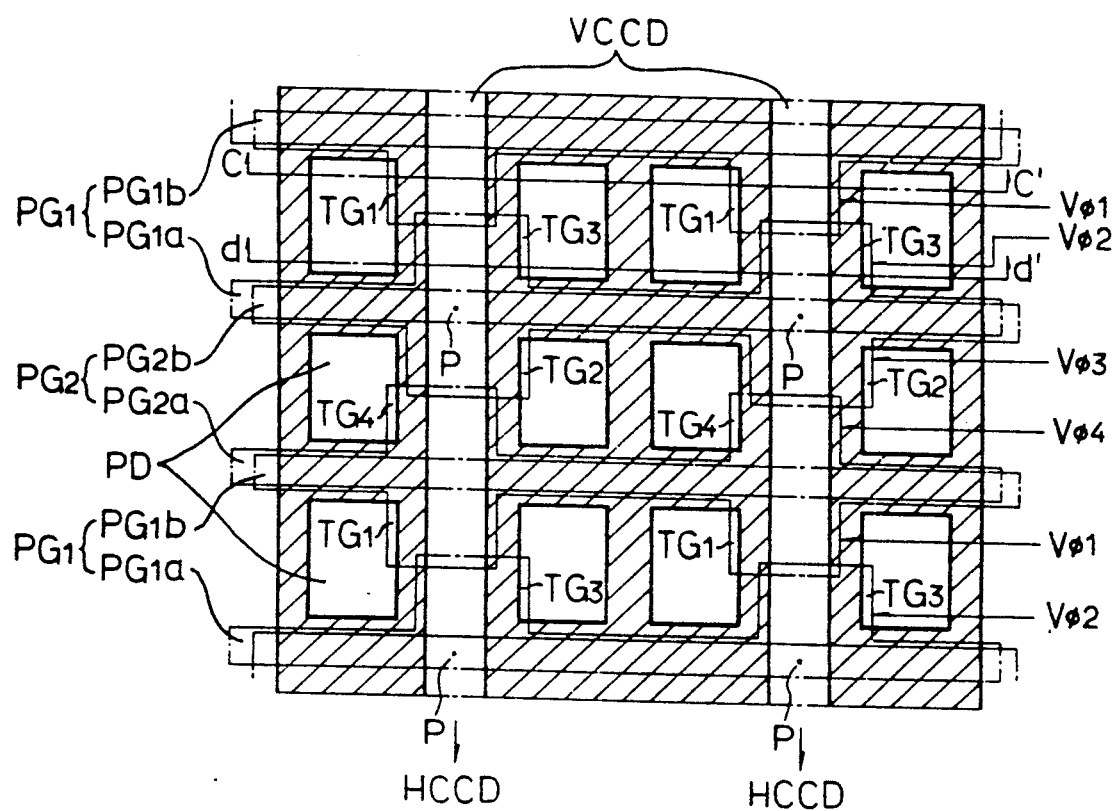
FIG. 4(b) is a layout diagram of FIG. 4(a)

FIG. 4(b) is a layout diagram of the CCD image sensor according to the present invention. As shown in FIG. 4(b), two photo diodes (PD), which are insulated from each other by a channel stop region (ST), are disposed consecutively parallel to each other between VCCD regions (VCCD). In an odd horizontal line of photo diodes (PD), an odd gate electrode ($PG_1$) for applying VCCD clock signals ($V\phi_1$-$V\phi_2$) is formed through over photo diode (PD), channel stop region (ST) and VCCD region (VCCD), while, in an even horizontal line in which photo diodes (PD) are disposed, an even gate electrode ($PG_2$) for applying VCCD clock signals ($V\phi_3$, $V\phi_4$) is formed through over photo diode (PD), channel stop region (ST) and VCCD region (VCCD).

Said odd gate electrode ($PG_1$) consists of a first odd gate electrode ($PG_{1a}$) which is formed under the photo diode (PD) disposed in the odd horizontal line, which is connected to a transfer gate ($TG_3$) of the photo diode (PD) formed in the right side of the VCCD region (VCCD) and to which the second VCCD clock signal ($V\phi_2$) is applied and a second odd gate electrode ($PG_{1b}$) which is formed in upper region of the photo diode (PD) disposed in the odd horizontal line, which is connected to a transfer gate ($TG_1$) of the photo diode (PD) formed in the left side of the VCCD region (VCCD) and to which the first VCCD clock signal ($V\phi_1$) is applied.

Further, said even gate electrode ($PG_2$) consists of a first even gate electrode ($PG_{2a}$) which is formed under the photo diode (PD) disposed in the even horizontal line, which is connected to a transfer gate ($TG_4$) of the photo diode (PD) formed in the left side of the VCCD region (VCCD) and to which the fourth VCCD clock signal ($V\phi_4$) is applied and a second even gate electrode ($PG_{2b}$) which is formed in upper region of the photo diode (PD) disposed in the even horizontal line, which is connected to transfer gate ($TG_2$) of the photo diode (PD) formed in the right side of the VCCD region (VCCD) and to which the third VCCD clock signal ($V\phi_3$) is applied.

Said odd gate electrode and even gate electrode are electrically insulated from each other by a insulating membrane which is not shown in Fig.

Figure 4C:
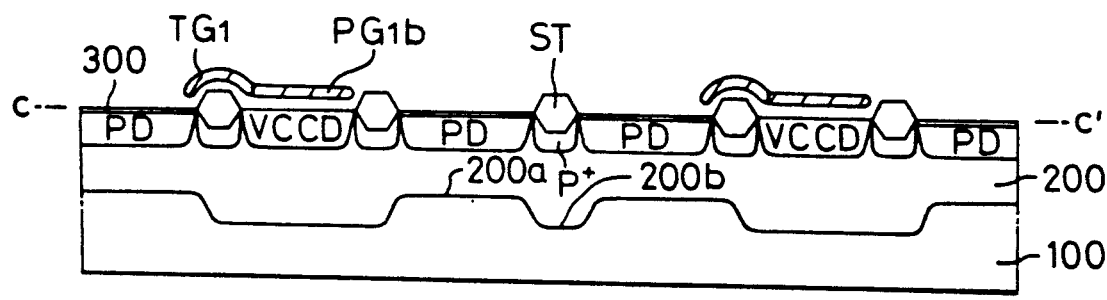
FIG. 4(c) is a cross sectional view taken along c—c' line of FIG. 4(b)
Figure 4D:
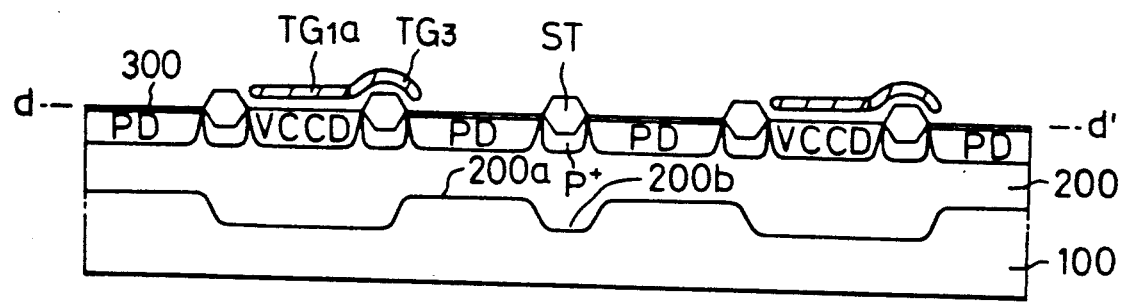
FIG. 4(d) is a cross sectional view taken along line d—d' of FIG. 4(b)

FIG. 4(c) shows a cross sectional view taken along c—c' line of FIG. 4(b). As shown in FIG. 4(c), a p-type well (200) is formed on an n-type substrate 100, an n- type photo diode (PD) and n-type VCCD region (VCCD) are consecutively formed on the surface of said p-type well 200 at a distance of channel stop region (ST), a transfer gate (TG$_1$) for connecting the photo diode (PD) formed at the left side of the VCCD region (VCCD) and the VCCD region (VCCD) is formed in the upper region of space between of them and a second odd gate electrode (PG$_{1b}$) of the odd gate electrode (PG$_1$) for applying the first VCCD clock signal (V$\phi_1$) is formed in the upper region of the VCCD region (VCCD).

The p-type well 200 consists of a shallow p-type well (200$a$) and a deep p-type well (200$b$) in order to control OFD voltage.

FIG. 4($d$) shows a cross sectional view taken along d—d' line of FIG. 4($b$), of which constitution is the same as in FIG. 4($c$). As shown in FIG. 4 ($d$), a transfer gate (TG$_1$) for connecting the VCCD region (VCCD) and the photo diode (PD) formed in the right side of the the VCCD region (VCCD) is formed in the upper region of space between them and a first odd gate electrode (PG$_{1a}$) of the odd gate electrode (PG$_1$) to which the second VCCD clock signal (V$\phi_2$) is applied is formed in the upper region of the VCCD region (VCCD) instead of the transfer gate (TG$_1$) and the second odd gate electrode (PG$_{1b}$) in FIG. 4($c$).

Operation of the above structure will be described in detail with reference to FIG. 5($a$) and 5($b$).

FIG. 5($a$) shows a timing diagram of the first to fourth VCCD clock signals (V$\phi_1$-V$\phi_4$) used in the invention, in which all the clock signals consist of 4 fields.

As shown in FIG. 5($a$), the first VCCD clock signal (V$\phi_1$) has a transfer gate driving voltage (V$_1$) of 15V in the first field, the second VCCD clock signal (V$\phi_2$) has a transfer gate driving voltage (V$\phi_2$) of 15V in the third field, and the third VCCD clock signal (V$\phi_3$) has a transfer gate driving voltage (V$_3$) of 15V in the second field while the fourth VCCD clock signal (V$\phi_4$) has a transfer gate driving voltage (V$_4$) of 15V in the fourth field.

FIG. 5($b$) shows a pulse waveform diagram of said first to fourth clock signals (V$\phi_1$-V$\phi_4$) generated at a unit section (K).

Image signal coming out of the photo diode (PD) with such a pulse waveform is shifted vertically toward the HCCD region (HCCD) shown in FIG. 4($a$) and 4($b$).

First, in the first field section of FIG. 5($a$), when the first to fourth VCCD clock signals (V$\phi_1$-V$\phi_4$) are applied to the odd gate electrode (PG$_1$) and even gate electrode (PG$_2$) simultaneously, the transfer gate (TG$_1$) of the photo diode (PD) which is formed in the left upper region of reference point (P) of FIG. 4($b$) is turned on by the transfer gate driving voltage (V$_1$) involved in the first VCCD clock signal (V$\phi_1$) which is applied through the second odd gate electrode (PG$_{1b}$) of the odd gate electrode (PG$_1$).

Consequently, an image signal charge generated at the photo diode (PD) is shifted to the VCCD region (VCCD), where it is vertically moved toward the HCCD region by clocking operation of the first to fourth VCCD clock signals (V$\phi_1$-V$\phi_4$) shown in FIG. 5($b$).

Next, in the second field section of FIG. 5($a$), when the first to fourth VCCD clock signals (V$\phi_1$-V$\phi_4$) are applied to the odd gate electrode (PG$_2$) and even gate electrode (PG$_2$) simultaneously, the transfer gate (TG$_2$) of the photo diode (PD) which is formed in the right lower region of reference point (P) of FIG. 4($b$) is turned on by the transfer gate driving voltage (V$_3$) involved in the third VCCD clock signal (V$\phi_3$) which is applied through the second even gate electrode (PG$_{2b}$) of the even gate electrode (PG$_2$).

Consequently, an image signal charge generated at the photo diode (PD) is shifted to the VCCD region (VCCD), where it is vertically moved toward the HCCD region by clocking operation of the first to fourth VCCD clock signals (V$\phi_1$-V$\phi_4$) shown in FIG. 5($b$).

Then, in the third field section of FIG. 5($a$), when the first to fourth VCCD clock signals (V$\phi_1$-V$\phi_4$) are applied simultaneously, the transfer gate (TG$_1$) of the photo diode (PD) which is formed in the right upper region of reference point (P) of FIG. 4($b$) is turned on by the transfer gate driving voltage (V$_2$) involved in the second VCCD clock signal (V$\phi_2$) which is applied through the first odd gate electrode (PG$_{1a}$) of the odd gate electrode (PG$_1$).

Consequently, an image signal charge generated at the photo diode (PD) is shifted to the VCCD region (VCCD), where it is moved to the HCCD region (HCCD) by clocking operation of the first to fourth VCCD clock signals (V$\phi_1$-V$\phi_4$) shown in FIG. 5($b$).

Finally, in the fourth field section of FIG. 5($a$), when the first to fourth VCCD clock signals (V$\phi_1$-V$\phi_4$) are applied to the odd gate electrode (PG$_1$) and even gate electrode (PG$_2$) simultaneously, the transfer gate (TG$_4$) of the photo diode (PD) which is formed in the left lower region of reference point (P) of FIG. 4($b$) is turned on by the transfer gate driving voltage (V$_4$) involved in the fourth VCCD clock signal (V$\phi_4$) which is applied through the first even gate electrode (PG$_{2a}$) of the even gate electrode (PG$_2$).

Consequently, an image signal charge generated at the photo diode (PD) is shifted to each VCCD region (VCCD), where it is moved vertically toward the HCCD region (HCCD) by clocking operation of the first to fourth VCCD clock signals (V$\phi_1$-V$\phi_4$) shown in FIG. 5($b$).

Herein, the reference point (P) of FIG. 4($b$) indicates a point located at the center of both odd and even horizontal lines, in the VCCD region (VCCD).

FIG. 5($c$) shows a state of a screen (i. e., a frame) displayed by the above operations.

In FIG. 5($c$), the number 1 represents a state that the image signal charge generated at the photo diode (PD) located in the left upper region of the reference point (P) in FIG. 4($b$) is displayed as a pixel, the number 2 represents a state that the image signal charge generated at the photo diode (PD) located in the right lower region of the reference point (P) in FIG. 4($b$) is displayed a pixel and the number 3 represents a state that the image signal charge generated at the photo diode (PD) located in the right upper region of the reference point (P) in FIG. 4($b$) is displayed as a pixel while the number 4 represents a state that the image signal charge generated at the photo diode (PD) located in the left lower region of the reference point (P) in FIG. 4($b$) is displayed as a pixel.

FIG. 5($d$) shows a state of screen displayed according to the above operation, considering each VCCD region (VCCD) as an imaginary photo diode region.

In FIG. 5($d$), the number 1+3/2 represents a state in which a value obtained by adding image signal charges generated at two photo diodes (PD) located in the left upper and the right upper regions respectively together and dividing it by 2 using a computing means, which is not described herein, is displayed as a pixel. The number 2+4/2 represents a state in which a value obtained by adding image signal charges generated at two photo diodes (PD) located in the left lower and right lower regions respectively together and dividing it by 2 is displayed as a Pixel.

The CCD image sensor according to the invention can improve resolution of the video by reducing its VCCD area and, thus, increasing the photodetector's area, and consequently, increasing the fill factor.

The CCD image sensor according to the invention can improve resolution of the video although the scanning speed is low since it is operated by a 4 phase clock signal consisting of 4 fields, so that it may be applied to camcorder or still camera applications which require high resolution.

What is claimed is:

1. A CCD image sensor comprising:
 a) a HCCD region elongated in a horizontal direction;
 b) a plurality of VCCD regions arranged at predetermined intervals in the horizontal direction, each of the VCCD regions elongated in a vertical direction and terminating at the HCCD region;
 c) a plurality of photodetectors for generating signal charges in accordance with incident light with each photodetector having a transfer gate connected to a VCCD region which outputs the signal charge generated by the photodetector to the connected VCCD region in response to a driving voltage applied to the transfer gate, the photodetectors being arranged in a plurality of photodetector groups with each group having
  i) a first photodetector pair having a first photodetector at the left of a particular VCCD region and a second photodetector at the right of the particular VCCD region, with both the first and the second photodetector being connected to the particular VCCD region, and
  ii) a second photodetector pair having a third photodetector at the left of the particular VCCD region and immediately below the first photodetector and a fourth photodetector at the right of the particular VCCD region and immediately below the second photodetector, with both the third and the fourth photodetector being connected to the particular VCCD region;
 d) a first gate electrode connected to the transfer gate of the first photodetector in each photodetector group for applying a first driving voltage embedded in a first VCCD clock signal;
 e) a second gate electrode connected to the transfer gate of the second photodetector in each photodetector group for applying a second driving voltage embedded in a second VCCD clock signal;
 f) a third gate electrode connected to the transfer gate of the third photodetector in each photodetector group for applying a third driving voltage embedded in a third VCCD clock signal;
 g) a fourth gate electrode connected to the transfer gate of the fourth photodetector in each photodetector group for applying a fourth driving voltage embedded in a fourth VCCD clock signal; and
 h) a timing means for first creating the first driving voltage in the first VCCD clock signal, next creating the fourth driving voltage in the fourth VCCD clock signal, then creating the second driving voltage in the second VCCD clock signal, and finally creating the third driving voltage in the third VCCD clock signal.

2. The CCD image sensor according to claim 1, characterized in that the gate electrodes are repeatedly formed on said VCCD regions, said gate electrodes being electrically separated from each other by an insulating membrane.

3. The CCD image sensor according to claim 2, characterized in that the gate electrodes are formed of poly silicon.

4. The CCD image sensor according to claim 1, characterized in that the photodetectors are photo diodes using a PN junction.

5. The CCD image sensor according to claim 1, characterized in that the transfer gates of the photodetectors are formed of poly silicon.

6. The CCD image sensor according to claim 1, characterized in that the width of the VCCD region along the horizontal direction is substantially equal to the width of the photodetectors along the horizontal direction.

* * * * *